United States Patent [19]
Stroh et al.

[11] Patent Number: 5,874,189
[45] Date of Patent: **\*Feb. 23, 1999**

[54] METHOD OF OPTIMIZING A CHIP PATTERN ON A SEMICONDUCTOR WAFER

[75] Inventors: Rudiger J. Stroh, Freiburg; Detlef Kunert, Denzlingen, both of Germany

[73] Assignee: Deutche ITT Industries GmbH, Freiburg, Germany

[ \* ] Notice: This patent issued on a continued prosecution application filed under 37 CFR 1.53(d), and is subject to the twenty year patent term provisions of 35 U.S.C. 154(a)(2).

[21] Appl. No.: 728,599

[22] Filed: Oct. 10, 1996

[30] Foreign Application Priority Data

Oct. 10, 1995 [DE] Germany ............ 195 37 756.7
Aug. 22, 1996 [EP] European Pat. Off. ............ 96113463.2

[51] Int. Cl.$^6$ .................................................. G03F 9/00
[52] U.S. Cl. ................................. 430/22; 430/30
[58] Field of Search ........................... 430/22, 30

[56] References Cited

U.S. PATENT DOCUMENTS 5,521,036  5/1996  Iwamoto et al. ............ 430/22

FOREIGN PATENT DOCUMENTS 0491375  6/1992  European Pat. Off. .

*Primary Examiner*—Christopher G. Young
*Attorney, Agent, or Firm*—Plevy & Associates

[57] ABSTRACT

A method is disclosed for optimizing a pattern of semiconductor chips, which includes a mask being aligned via a reference point on the mask and an alignment mark on the wafer. The relative spatial position of the alignment mark is determined by a procedure for optimizing quantities which determine the fabrication costs of a semiconductor chip, while the position of the semiconductor chips relative to each other remain fixed during the optimization.

12 Claims, 3 Drawing Sheets

Arrangement of chips:

p = 1 : 21 steps p = 2 : 19 steps p = 3 : 20 steps p = 4 : 21 steps

METHOD OF OPTIMIZING A CHIP PATTERN ON A SEMICONDUCTOR WAFER

BACKGROUND OF THE INVENTION

1. Field of the Invention

The present invention relates generally to semiconductor fabrication and more particularly, to a method of optimizing a pattern of semiconductor devices, particularly Integrated Circuit (IC) chips, on a photoresist-coated semiconductor wafer onto which the semiconductor chips are imprinted by means of a mask.

2. Description of the Prior Art

A method for optimizing a pattern of semiconductor chips on a wafer is disclosed in DE 32 47 141. This method takes into account the problem that a wafer has particular areas onto which no semiconductor chips are to be imprinted. Such areas commonly serve to imprint test patterns, which are desirable for the manufacturer or are needed in order to align the exposure equipment. To reduce the loss of wafer area in the region around these test patterns, the patterns to be imprinted, i.e., the step fields, are varied relative to each other so that no empty areas will remain around the areas to be kept free.

There are processes which involve the fabrication of a mask by means of which the full chip pattern on the wafer is exposed at once. In other processes, a mask comprises a step field of semiconductor chips. In that case, use is made of a stepper with which the step fields, containing a given number of semiconductor chips, are imprinted onto the wafer in a step-and-repeat fashion by means of the mask. After that, the photoresist is developed. This is followed by a predetermined process, such as etching or ion implantation. After this process step, the photoresist material is removed from the wafer, which completes the first patterning step of the semiconductor fabrication process. In the same manner, further patterning steps are performed, in which the mask for producing the step field pattern must be aligned like the corresponding mask in the first patterning step. The mask used in the first patterning step is commonly aligned so that its longitudinal axis coincides with the longitudinal axis of the wafer and that it is moved in the direction of the longitudinal axis so as not to overlap the wafer areas to be exposed.

It is therefore, an object of the present invention to provide a method whereby the fabrication costs per semiconductor chip is reduced.

SUMMARY OF THE INVENTION

A method is disclosed for optimizing a pattern of semiconductor devices on a wafer, wherein the semiconductor devices are imprinted on the wafer by utilizing a mask. The method includes: applying a layer of photoresist to the wafer; optimizing a quantity related to the pattern of semiconductor devices in order to minimize the fabrication costs; and aligning the mask over the wafer in order to enable etching of the layer of photoresist layer, wherein the aligning step is performed by a reference point on the mask and an alignment mark on the wafer having a relative spatial position determined by the optimizing step.

In the method according to the invention, unlike conventional methods, the mask is not aligned as symmetrically as possible with respect to the center of the wafer. According to the invention, prior to the alignment, an optimization is performed for optimizing those quantities which determine the fabrication costs of a semiconductor chip. This optimization determines the alignment, so that more effective wafer exposure can save fabrication costs per semiconductor chip.

BRIEF DESCRIPTION OF THE DRAWING

The above objects, further features and advantages of the present invention are described in detail below in conjunction with the drawings, of which.

DETAILED DESCRIPTION OF THE DRAWING

Figure 1:
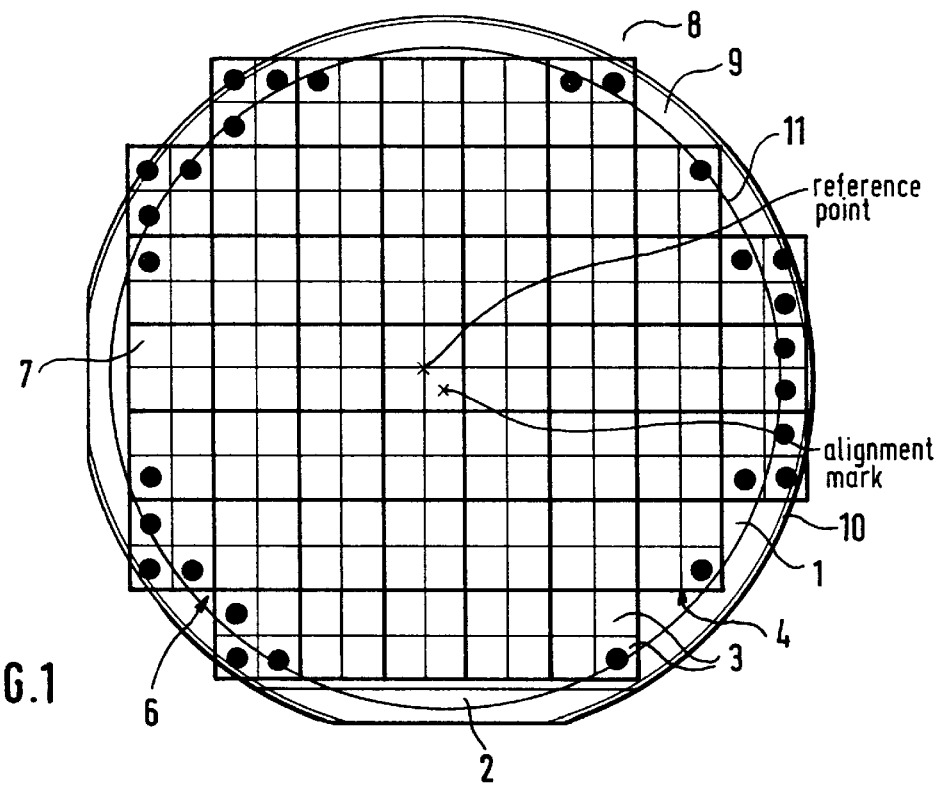
FIG. 1 shows an optimized step field pattern according to the present invention.

The present invention is directed to a method for optimizing a pattern of semiconductor chips on a semiconductor wafer. In the method according to the present invention, unlike conventional methods, the mask is not aligned as symmetrically as possible with respect to the center of the wafer. According to the invention, prior to the alignment, an optimization is performed for optimizing those quantities which determine the fabrication costs of a semiconductor chip. This optimization determines the alignment, so that more effective wafer exposure can save fabrication costs per semiconductor chip.

In a first embodiment of the present invention, the optimization is carried out prior to the fabrication of the mask. At the same time, the form of the mask, which depends on the semiconductor chips to be imprinted onto the wafer, is determined. This is advantageous, when only one mask is used to imprint the full chip pattern at once. In that case, the form of the mask is determined during the optimization. The form of the mask is fixed when the position of the mask on the wafer has been defined, thereby determining which semiconductor chips cannot be accommodated on the wafer areas to be exposed and thus are excluded from the mask.

In a second embodiment of the present invention, the mask is designed to imprint a step field comprising at least one semiconductor chip, and the step fields are exposed on the wafer by means of the mask in a step-and-repeat fashion. In the case of this step field pattern, the form of the mask is fixed, which is determined by the number of chips and the chip pattern. The step fields are then imprinted onto the semiconductor wafer in a step-and-repeat fashion. The optimization is advantageously carried out prior to the first mask exposure. Then the position of the mask for the subsequent steps has already been fixed. In carrying out the optimization, the raster of all semiconductor chips to be disposed on the wafer is taken into account, of course.

In a third embodiment of the present invention, a quantity is determined which corresponds to the number of semiconductor chips that can be disposed on the wafer, and for the optimization, the maximum number is determined. It has been found experimentally that with this optimization, a significantly greater number of semiconductor chips can be formed on the wafer than is possible with a symmetrical arrangement of the mask on the wafer as is the case in the prior art. Process costs per semiconductor chip are thus reduced correspondingly.

In a fourth embodiment of the present invention, a quantity is determined corresponding to the number of step fields, and for the optimization, the minimum number is determined. It has been found experimentally that this significantly reduces the number of step fields, and thus the number of steps to be performed by the stepper to expose the wafer, in comparison with the conventional symmetrical arrangement. Since the number of steps of the stepper determines the process time, and thus the process costs of the fabrication of the wafer with the semiconductor chips, a reduction of the number of steps to be performed by the stepper significantly reduces the fabrication costs per wafer and per chip. This becomes particularly apparent if in a given process the exposure of the chip pattern onto the resist-covered wafer is very expensive. Depending on what kind of process is carried out for imprinting the chips, the step field pattern can be determined by minimizing only the number of step fields, by maximizing only the number of chips that can be disposed on the wafer, or by optimizing both parameters simultaneously. Which method will save the most costs under given process conditions can be determined in an individual case by the person skilled in the art.

Furthermore, it is advantageous to perform the optimization with boundary conditions determined by the fabrication process. Through such boundary conditions, costs can be further reduced. As boundary conditions include exclusion areas where no step fields are imprinted, exposure areas where step fields are imprinted in any case and/or test areas where test patterns are to be imprinted, can be determined on the wafer. Which of these boundary conditions is advantageous in a given process can be determined in an individual case by the person skilled in the art. Determining exclusion areas is advantageous if particular areas, such as for inscriptions for gripping the wafer are not to be used to imprint semiconductor chips. It is also possible to exclude areas where chips are expected to be faulty or of poor quality so that these should not be used. One reason for this problem is the poor quality of the applied photoresist, particularly in the edge areas of the wafer. If no chips are imprinted on these exclusion areas, the process time and, thus, the process costs are further reduced. As exposure areas, areas can be chosen where exposure is necessary, e.g., to ensure stability of the photoresist applied to the wafer. This is particularly advantageous if a given type of photoresist applied to a large area of a given wafer material is not patterned which tends to chip off. Test areas will advantageously be provided if test patterns are necessary in particular processes to carry out or control the process.

Advantageously, if two or more step field patterns with equal optimized quantities are determined, the pattern in which the distance from the chips to the periphery of the wafer is maximal will be chosen. Thus, the chips are imprinted onto that area of the wafer where the photoresist conditions, and thus the conditions for the chips to properly function are the best. The optimization procedure is advantageously carried out by means of a computer. This permits a very precise optimization of the step field pattern. All possible chip patterns on the wafer, or step field patterns, can be tried one after the other.

A further quantity for optimization is the side/length ratio of the step fields, with the semiconductor chips being grouped into step fields. For a given number of chips, the number of step fields can be reduced.

As still further quantity for optimization is the side/length ratio or the area of the semiconductor chips, particularly of the IC chips. The IC chips are rotated by, e.g., 90° if more IC chips are formed on the wafer in such a configuration. The number of IC chips on the wafer is also maximized by changing the area of the IC chips. It has been found that there are cases in which, if the IC chips have a larger area and a suitable length/side ratio, more IC chips are formed on the wafer than if the chips have a smaller area. Furthermore, the arrangement of the switching blocks of an IC chip are varied until the side/length ratio which comes closest to the calculated ratio is reached. To optimize the quantities determining the fabrication costs of an IC, the mask is moved relative to the wafer in steps by arithmetic simulation, and the relative position is determined via the relative position of reference point and alignment mark, which are stored depending on the spatial position and are compared for different positions. This is a reliable procedure for optimizing the step field pattern.

Referring to FIG. 1, there is shown a step field pattern optimized by utilizing the second, third and fourth embodiments of present invention in combination. A wafer 1 comprises an exclusion area 2 which is reserved for inscriptions, so that no IC chips are formed thereon. On the wafer 1, IC chips 3 have been formed, which are arranged in step fields 4. The IC chips 3 marked with the symbol "●" are those IC chips which, due to poor process conditions, are not suitable for use after production. The poor process conditions in this case is due to the IC chips 3 being located too close to the periphery of the wafer 1.

An embodiment of the method according to the present invention by which the result of FIG. 1 was achieved will now be described. A photoresist layer 9, suitably chosen for the process conditions, is applied to the wafer 1 by a process familiar to those skilled in the art. As a result of this process, a border area 10 is formed which is not covered by any photoresist material. The interior of the border area 10 is marked by a limiting line 11 which ensures the homogenous processing of the wafer 1.

Before the wafer 1 is exposed, an optimization of the step field pattern 6 to be imprinted onto the wafer 1 is carried out with a computer. In order to perform this optimization, the necessary boundary conditions are fed to the computer. These are the diameter of the wafer 1, the length/side ratio of the IC chips, the length/side ratio of the step fields, the exclusion area 2 where no step fields 4 are to be imprinted, and an edge region of the wafer 1 onto which IC chips are to be imprinted which are not to be used. By means of the computer, a simulation is then carried out. First, the number of IC chips 3 which can be utilized on the area of the wafer 1 outside the exclusion area 2 is maximized. In order to perform the maximization, the IC chips 3 are first formed on the available wafer area 7 in such a way that their arrangement is symmetrical with respect to the center of the wafer 1. This enables the number of usable IC chips 3 to be determined. Then, the whole chip pattern is moved relative to the center of the wafer 1 both in the x direction and in the y direction according to a predetermined system. In each of these positions, the number of usable IC chips 3 that can be accommodated on the wafer area 7 is determined and stored. By comparing the number of these IC chips for the different positions, the position of the mask 8 with the maximum number of such IC chips 3 is determined.

After that, the various possibilities of grouping the ICs of this chip pattern into step fields are simulated. For each possibility, the number of step fields is determined. By a comparison, the minimum number is determined. The result is the step field pattern of FIG. 1 where out of the total 192 IC chips, 18 are not usable thereby providing 164 usable IC chips 3 that are imprinted. The number of steps to be performed by the stepper is 49.

Figure 2:
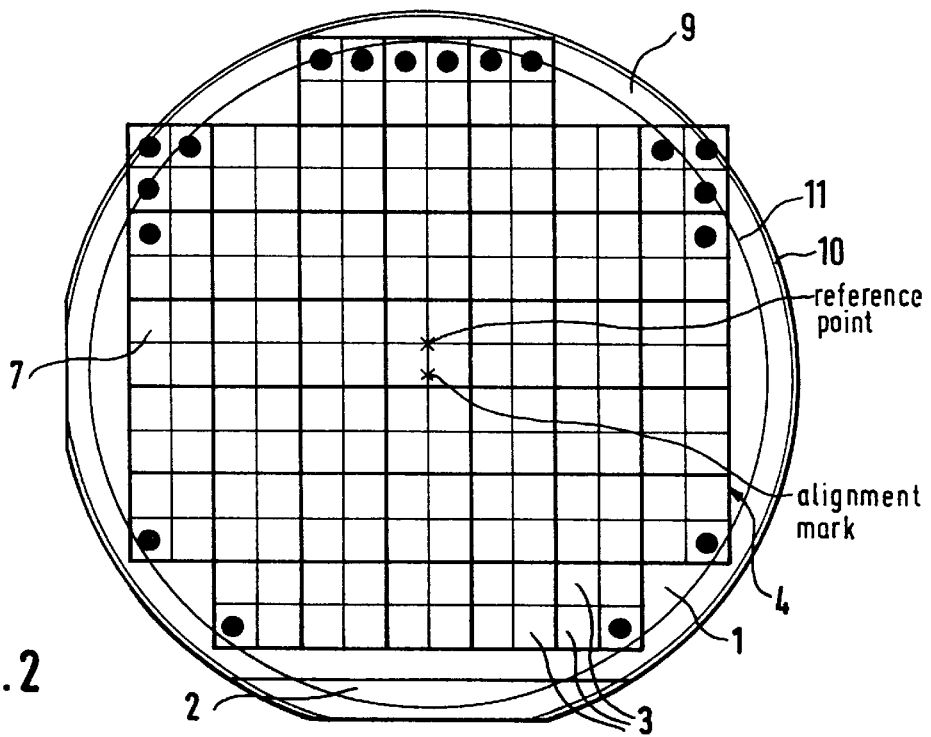
FIG. 2 shows a conventional step field pattern for the same IC chips on the same wafer.

In comparison thereto, FIG. 2 shows a pattern which was imprinted onto the wafer under the same boundary conditions, i.e., wafer diameter, length/side ratio of the chips, length/side ratio of the step fields, and exclusion area 2, by a conventional method without optimization. The mask was only moved in the y direction so that the IC chips 3 were not imprinted on the exclusion area 2. The pattern of IC chips 3, or the step field pattern 6, is symmetrical with respect to the y-axis of the wafer 1 through the wafer center. Despite the symmetry, considerably fewer IC chips are imprinted on the wafer 1 in this case. This is because out of the 172 total chips 3, 18 are not usable thereby providing a smaller number usable IC chips 3 which in this case is 154. The number of steps to be performed by the stepper to imprint the IC chips 3 onto the wafer 1 is 43. Thus, in the method according to the present invention, approximately 10% more IC chips are formed on a wafer. This reduces the fabrication costs per IC chip considerably.

After determination of the optimized step field pattern, the wafer 1 is exposed in the predetermined step-and-repeat fashion by means of the stepper. To do this, prior to the exposure, the necessary information, particularly on the position of the reference point 12 on the mask 8 relative to the alignment mark 13 on the wafer 1, is fed to the stepper. This is followed by the usual fabrication steps. The exposed photoresist is developed, the desired process step, such as oxidation, ion implantation, etc., is carried out, and the remaining photoresist is removed from the wafer. This completes the first patterning step. The further patterning steps are carried out in the conventional manner, with mask alignment being performed via the position of the reference point on the mask relative to the alignment mark on the wafer, which position was determined in the first step.

Figure 3:
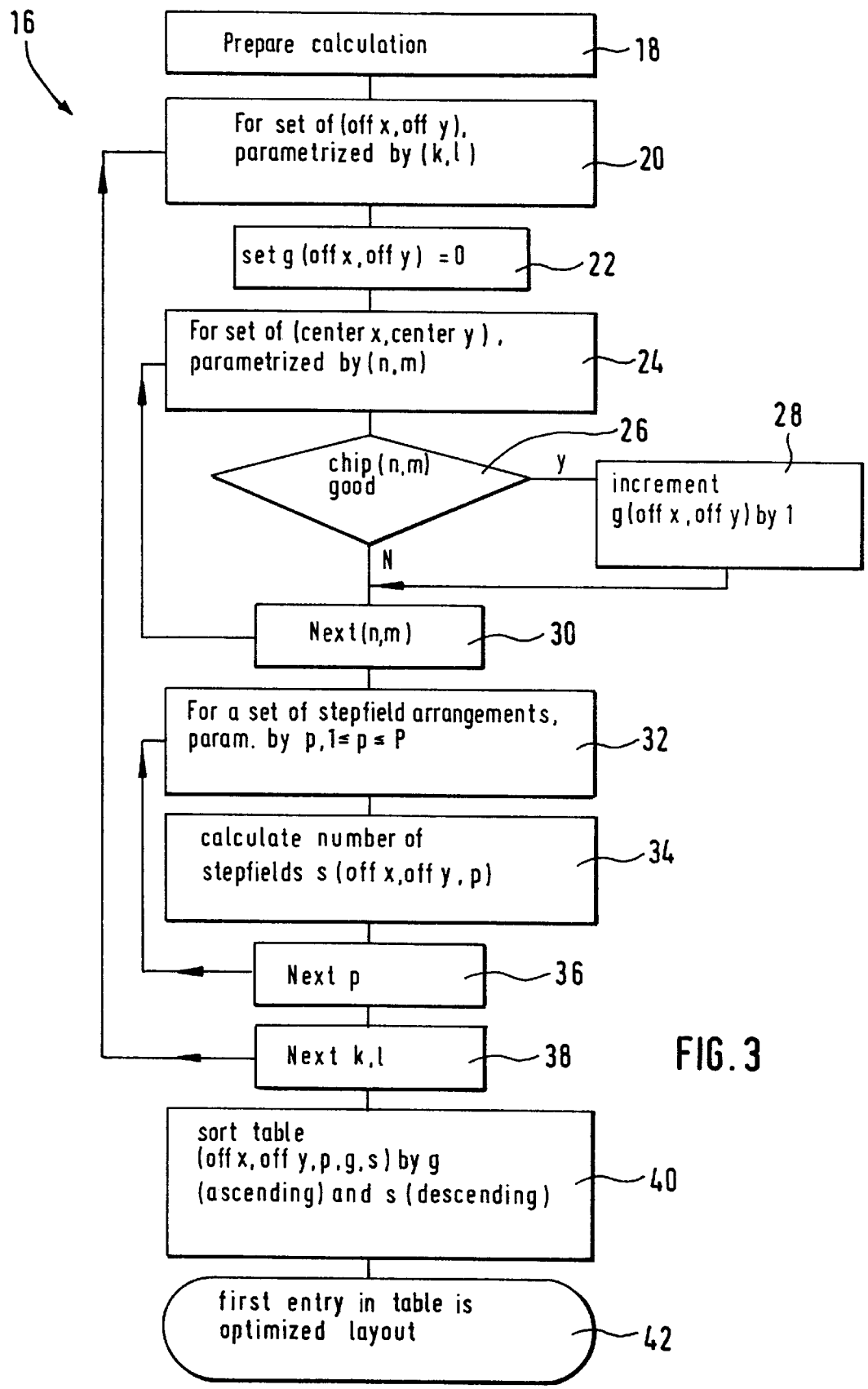
FIG. 3 is a flow diagram showing a detailed embodiment of the method for optimizing a pattern of semiconductor chips according to the present invention.

Referring to FIG. 3, a flow diagram showing a detailed embodiment of the previously described method for optimizing a pattern of semiconductor chips according to the present invention is shown. This method 16 does not require chips to be generally aligned symmetrically to the center of the wafer. The chips are only required to be arranged in a rectangular pattern. If the parameters chip-x and chip-y are the dimensions of the chip which include the scribe lines separating the chips where the wafers are cut, the center point coordinates (center-x, center-y) of a particular chip(n, m) are given by:

$$\text{center-}x = \text{off-}x + n * \text{chip-}x, \text{ and} \quad (1)$$

$$\text{center-}y = \text{off-}y + m * \text{chip-}y, \quad (2)$$

where center-x and center-y are relative to the center of the wafer, off-x and off-y correspond to the origin of the chip matrix relative to the center of the wafer and, n and m are integer values.

The method 16 first prepares the calculation 18, which includes defining exclusion zones on the wafer. The chips not touching these exclusion zones are discarded during the manufacturing process. A typical exclusion zone is the area on the wafer which is within 3 mm from the edge of the wafer. The next step is to form a set of different possible chip matrix origins (off-x and off-Y) 20 which correspond to the set of integers (k,l). This is accomplished by determining n-step-x and n-step-y values which correspond to the number of chips in the x and y directions in a step field.

The method 16 then selects a starting value for both off-x and off-y 22, which preferably are zero. Then, a set of center point coordinates (center-x, center-y) are formed 24 which correspond to the different positions of a particular chip(n, m) in the matrix having the previously selected chip matrix origin. The center point coordinates (center-x, center-y) must be calculated to ensure that the chips cover the wafer completely by utilizing Equations 1 & 2. Next, for each chip(n,m) it is calculated and recorded 26 whether it lies in completely on the wafer and does not touch a previously defined exclusion zone. This enables the number of (good) chips (n,m) fulfilling these conditions to be recorded. This step 26 is performed individually for each chip and is repeated by looping through steps 24, 26 & 30 until the number of chips included in the matrix is exhausted.

Figure 4:
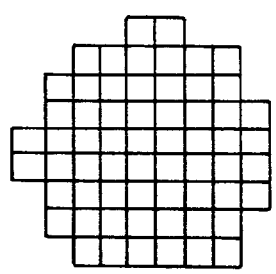
FIG. 4 is diagram illustrating the different possible step field arrangements.
Figure 4:
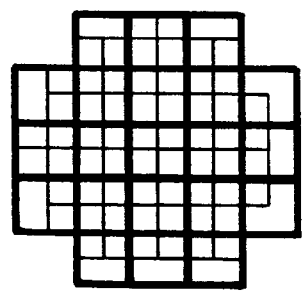
Figure 4:
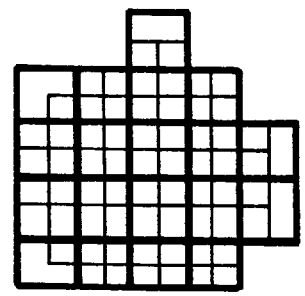
Figure 4:
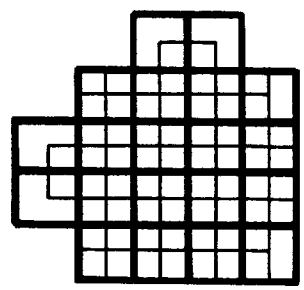
Figure 4:
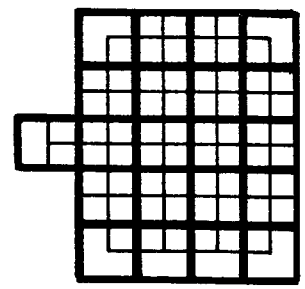

After all the chips are exhausted 30, a set of step field arrangements are formed 32 which are the different possible step field arrangements for the chips on the wafer. In this step 32, each arrangement is identified by a number p and the arrangements are accomplished by grouping the good chips so that each group is exposed in one step and such that each chip is one group. Then, for each step field arrangement p, the number of step fields are calculated and recorded 34. This step 34 is performed individually for each step field arrangement p by continually looping through steps 32, 34 and 36 until the number of step field arrangements are exhausted. For each arrangement, the information is recorded in the form of s(off-x, off-y, p), where s is the number of groups corresponding to the number of steps that need to be exposed. Examples of the different step field arrangements are shown in FIG. 4. As can be seen, for each step field arrangement p the number of steps vary.

Still referring to FIG. 3, after all the step field arrangements p are exhausted 36, the next k, 1 value is chosen 38 which corresponds to the next corresponding chip matrix origin (off-x and off-y). Steps 18-36 are repeated for each additional chip matrix origin (off-x and off-Y) until all of these are exhausted. In this method 16, the number chip matrix origins (off-x and off-Y) is preferably a large number. Further, the choice of the chip matrix origin (off-x and off-Y) is equivalent to aligning the reference point on the mask to an alignment mark on the wafer. The chip matrix origin (off-x and off-Y) is incremented by predefined values delta-x and delta-y, and are repeated for a set of (k,1) as defined by:

$$k = 0,1,2 \ldots K, \text{and} \quad (3)$$

$$l = 0,1,2 \ldots L, \quad (4)$$

$$\text{off-}x = k * \text{ delta-}x, K * \text{delta-}x > \text{chip-}x, \quad (5)$$

$$\text{off-}y = l * \text{ delta-}y, L * \text{delta-}y > \text{chip-}y, \quad (6)$$

where k, l, K, L are integers. This ensures that a sensible range of off-x and off-y is covered homogeneously. Note that the value off-x>chip-x is equivalent to (off-x—chip-x) since the grid of chips is periodic in the x-direction with the period chip-x and in the y-direction with period chip-y.

After the number of chip matrix origins (of f-x and off-Y) are exhausted 38, a sort table 40 is performed. This step 40 includes sorting a large table with all the combinations (off-x, off-y, p) which were generated in the previous step 34. The table is sorted in the following manner:

$$\text{off-}x\text{off-}yp g(\text{off-}x,\text{off-}y) s(\text{off-}x,\text{off-}y,p)$$

The above sorting format includes sorting first by descending order (g) and secondly by ascending order (s). After the sorting is completed 40, the first entry in the table is the optimized layout 42. The optimized layout includes the maximum number of good IC chips on the wafer, which are exposed by with a minimum number of steps. By evaluating the parameters off-x, off-y and p along with the arrangement that resulted from this combination of parameters, it is possible determine how to adjust the exposure equipment in order to realize this optimized arrangement.

The above-described embodiment of the method is one embodiment of the invention. Many further embodiments are conceivable, depending on the process conditions. It is also possible to vary the sequence of operations and the performance of the optimization. Details of the various implementations are left to those skilled in the art.

What is claimed is:

1. A method for optimizing a pattern of semiconductor devices on a wafer wherein the semiconductor devices are imprinted on the wafer by utilizing a mask, said method comprising the steps of:

applying a layer of photoresist to the wafer;

optimizing the number of semiconductor devices imprinted on the wafer in a symmetrical arrangement in order to minimize the fabrication costs by varying the side/length ratio or the area of the semiconductor devices; and, aligning the mask over the wafer in order to enable etching of the photoresist layer, wherein said aligning step is performed by a reference point on the mask and an alignment mark on the wafer having a relative spatial position determined by said optimizing step.

2. The method of claim 1, wherein:

said varying comprises determining the number of useable semiconductor devices that is accommodated by the wafer with each semiconductor device having a plurality of side/length ratios thereby providing a first plurality of numbers; and, said optimization further comprises comparing said first plurality of numbers in order to determine an optimum configuration which yields the maximum number of semiconductor devices able to be imprinted on the wafer relative to said plurality of semiconductor device side/length ratios.

3. The method of claim 1, further comprising keeping the position of the semiconductor devices within said pattern relative to each other fixed.

4. The method of claim 1, wherein the mask is configured to imprint the entire pattern of semiconductor devices on the wafer simultaneously.

5. The method of claim 1, wherein said optimizing step further comprises utilizing boundary conditions of the wafer, which include exclusion areas, exposures area and test areas.

6. The method of claim 4, wherein said maximizing the number of semiconductor devices further comprises the method selected from the group consisting of rotating the semiconductor devices and varying the arrangement of switching blocks for each semiconductor device.

7. The method of claim 2, which further includes saving said first plurality of numbers before said comparing step.

8. The method of claim 1, wherein said optimizing step is performed electronically.

9. A method for optimizing imprinting a pattern of semiconductor devices on a wafer utilizing a mask and a step field pattern, said method comprising the steps of:

applying a layer of photoresist to the wafer;

arranging the semiconductor devices in a plurality of step field configurations;

determining the side/length ratio of the step fields for each said step field configuration of said plurality thereby providing a first plurality of numbers;

comparing said first plurality of numbers in order to determine a preferred step field configuration having a minimum number of step fields relative to said plurality of step field configurations; and, aligning the mask over the wafer in order to enable etching of the photoresist layer, wherein said aligning step is performed by a reference point on the mask and an alignment mark on the wafer having a relative spatial position determined by said preferred step field configuration.

10. The method of claim 9, further comprising the method selected from the group consisting of varying the area of the semiconductor devices, rotating the semiconductor devices and varying the arrangement of switching blocks for each of the semiconductor devices.

11. The method of Claim 9, wherein if during said optimizing step two or more step field patterns with equal number of steps are determined, the one of the two or more step field patterns is chosen having the maximum distance between the semiconductor devices and the periphery of the wafer.

12. A method of optimizing a pattern of semiconductor chips on a photoresist-coated semiconductor wafer onto which said semiconductor chips are imprinted by means of a mask, comprising the steps of:

optimizing at least one quantity related to the fabrication cost of each of said semiconductor chips;

further optimizing the side/length ratio of step fields which said semiconductor chips are grouped into; and, aligning said mask via a reference point on the mask and an alignment mark on the wafer whose relative spatial position is determined by said optimizations, wherein the positioning of the semiconductor chips relative to each other remains fixed during said optimization.

* * * * *